(12) United States Patent
Yun et al.

(10) Patent No.: US 11,365,069 B2
(45) Date of Patent: Jun. 21, 2022

(54) REVERSING UNIT AND SUBSTRATE TREATING APPARATUS INCLUDING THE SAME

(71) Applicant: SEMES CO., LTD., Chungcheongnam-do (KR)

(72) Inventors: Seong Hyun Yun, Gyeonggi-do (KR); Jung Hwan Lee, Gyeonggi-do (KR); Jinseok Ham, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 396 days.

(21) Appl. No.: 16/723,484

(22) Filed: Dec. 20, 2019

(65) Prior Publication Data
US 2020/0198903 A1 Jun. 25, 2020

(30) Foreign Application Priority Data
Dec. 21, 2018 (KR) .......... 10-2018-0167406

(51) Int. Cl.
| | | |
|---|---|---|
| H01L 21/677 | (2006.01) | |
| B65G 49/06 | (2006.01) | |
| G02F 1/13 | (2006.01) | |

(52) U.S. Cl.
CPC ......... *B65G 49/061* (2013.01); *G02F 1/1303* (2013.01); *H01L 21/67742* (2013.01)

(58) Field of Classification Search
CPC .... B65G 49/061; B65G 47/902; B25J 9/0093; H01L 21/67742; G02F 1/1303
(Continued)

(56) References Cited

U.S. PATENT DOCUMENTS 5,061,144 A * 10/1991 Akimoto ........... H01L 21/68707
414/935
5,669,644 A * 9/1997 Kaihotsu ........... H01L 21/68707
294/902
(Continued)

FOREIGN PATENT DOCUMENTS

JP 2004-158625 A 6/2004
JP 4600856 B 12/2010
(Continued)

OTHER PUBLICATIONS

Korean Notice of Allowance for related Application No. 10-2021-0044491, dated Jan. 19, 2022, 2 pages.
(Continued)

*Primary Examiner* — Paul T Chin
(74) *Attorney, Agent, or Firm* — Procopio, Cory, Hargreaves & Savitch LLP

(57) ABSTRACT

The inventive concept provides an apparatus for supporting a substrate. An apparatus for treating a substrate includes a process chamber that performs a predetermined process on the substrate and a reversing unit that reverses the substrate. The reverse unit includes a grip unit that grips the substrate and a drive unit that rotates the grip unit to reverse the substrate gripped by the grip unit. The grip unit includes a first body that supports one of an upper surface and a lower surface of the substrate and a second body that supports the other surface of the substrate. Each of the first body and the second body includes a support protrusion that is brought into contact with the substrate when the grip unit grips the substrate.

19 Claims, 10 Drawing Sheets

(58) Field of Classification Search
USPC .......................................................... 294/213
See application file for complete search history.

(56) References Cited

U.S. PATENT DOCUMENTS

| | | | | |
|---|---|---|---|---|
| 5,711,646 | A * | 1/1998 | Ueda | H01L 21/68707 |
| | | | | 279/3 |
| 6,174,011 | B1 * | 1/2001 | Keigler | H01L 21/68707 |
| | | | | 294/99.1 |
| 6,322,119 | B1 * | 11/2001 | Schmidt | H01L 21/67742 |
| | | | | 414/744.8 |
| 6,635,516 | B1 * | 10/2003 | Komatsu | H01L 21/68728 |
| | | | | 438/678 |
| 6,722,834 | B1 * | 4/2004 | Tepman | H01L 21/68707 |
| | | | | 414/217 |
| 7,048,316 | B1 * | 5/2006 | Blank | H01L 21/68707 |
| | | | | 294/902 |
| 7,690,881 | B2 * | 4/2010 | Yamagishi | H01L 21/67745 |
| | | | | 294/902 |
| 8,141,926 | B2 * | 3/2012 | Fujii | H01L 21/68707 |
| | | | | 414/941 |
| 8,215,890 | B2 * | 7/2012 | Tseng | H01L 21/67265 |
| | | | | 414/940 |
| 8,322,766 | B1 * | 12/2012 | Hsiung | B25J 11/0095 |
| | | | | 294/902 |
| 8,376,428 | B2 * | 2/2013 | Rebstock | H01L 21/68707 |
| | | | | 294/902 |
| 8,920,107 | B2 * | 12/2014 | Ikeda | B25J 9/042 |
| | | | | 414/744.1 |
| 9,004,561 | B2 * | 4/2015 | Rebstock | B08B 3/12 |
| | | | | 294/902 |
| 9,701,024 | B2 * | 7/2017 | Rebstock | B25J 9/00 |
| 9,929,034 | B2 * | 3/2018 | Goto | H01L 21/67778 |
| 2009/0003973 | A1 * | 1/2009 | Choi | B25J 18/04 |
| | | | | 901/27 |
| 2012/0305024 | A1 * | 12/2012 | Kang | H01L 21/67742 |
| | | | | 134/76 |
| 2014/0210224 | A1 * | 7/2014 | Hashimoto | H01L 21/68707 |
| | | | | 901/30 |
| 2020/0126838 | A1 * | 4/2020 | Liu | H01L 21/68 |
| 2020/0223644 | A1 * | 7/2020 | Haraguchi | B65G 1/14 |

FOREIGN PATENT DOCUMENTS

| | | |
|---|---|---|
| JP | 2012186391 A | 9/2012 |
| KR | 10-0466294 B | 1/2005 |
| KR | 10-0778394 B | 11/2007 |
| KR | 10-0858634 B1 | 9/2008 |
| KR | 10-2012-0133967 A | 12/2012 |
| KR | 10-1374668 B1 | 3/2014 |
| KR | 10-1679410 B | 11/2016 |

OTHER PUBLICATIONS

Office Action for related Korean Patent Application No. 10-2018-0167406, dated Apr. 16, 2020 (8 pages).

* cited by examiner

REVERSING UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2018-0167406 filed on Dec. 21, 2018, in the Korean Intellectual Property Office, the entire contents of which are hereby incorporated by reference.

BACKGROUND

Embodiments of the inventive concept described herein relate to an apparatus for supporting a substrate, and more particularly, relate to an apparatus for reversing a substrate.

A photomask is a quartz or glass substrate covered with a pattern corresponding to a minute semiconductor circuit. For example, a chromium thin layer applied on an upper layer of a transparent quartz substrate is etched to form a pattern corresponding to a semiconductor integrated circuit or a liquid crystal display (LCD) circuit. The size of the pattern is one to five times greater than that of the semiconductor integrated circuit or the LCD circuit. The minute pattern of the photomask is formed on the substrate through a photolithography process. In the photolithography process, a photoresist is uniformly applied to the substrate, a scale-down projection/exposure process is performed using the pattern of the photomask and an exposure device such as a stepper, and then, a development process is performed to form a two-dimensional photoresist pattern.

If foreign matter is attached to the photomask, the foreign matter scatters or absorbs light during an exposure process to degrade optical resolution, thereby causing a significant defect in a pattern formed on a substrate. Thus, a pellicle as a protective member is installed over the photomask during the exposure process in order to protect the photomask from foreign matter. The pellicle is disposed at a certain height over the pattern of the photomask such that even though foreign matter is attached to the pellicle, the foreign matter does not affect an image formed on the substrate during the exposure process.

The photomask may be cleaned in a wet cleaning apparatus using a chemical such as a sulfuric peroxide mixture (SPM). When the photomask having foreign matter such as an adhesive remaining thereon is used again in an exposure process, the foreign matter may be gradually grown as haze defects by catalysis energy of light as the exposure process is performed. Because such growing haze defects cause undesirable pattern transfer, the foreign matter such as the adhesive has to be effectively removed from the photomask.

The photomask is loaded into a photomask cleaning apparatus in the state in which a cleaning target surface of the photomask (a patterned surface thereof) is directed downward (inverted). Therefore, the photomask cleaning apparatus includes a reversing unit for reversing the photomask. The reversing unit reverses the photomask in the state of gripping the photomask by making surface-to-surface contact with opposite sides of the photomask.

However, the photomask may be contaminated by contaminants on a grip part of the reversing unit in the process of being gripped by the grip part. In addition, damage such as scratches may occur to cause particles when the grip part grips the photomask by making surface-to-surface contact with the photomask in the state in which the photomask or the grip part is not maintained in a horizontal state.

SUMMARY

Embodiments of the inventive concept provide an apparatus for minimizing damage to a substrate in a process of supporting or gripping the substrate.

Embodiments of the inventive concept provide an apparatus for minimizing contamination of a substrate in a process of supporting and gripping the substrate.

According to an exemplary embodiment, an apparatus for supporting a substrate is provided.

According to an exemplary embodiment, an apparatus for treating a substrate includes a process chamber that performs a predetermined process on the substrate and a reversing unit that reverses the substrate. The reverse unit includes a grip unit that grips the substrate and a drive unit that rotates the grip unit to reverse the substrate gripped by the grip unit. The grip unit includes a first body that supports one of an upper surface and a lower surface of the substrate and a second body that supports the other surface of the substrate. Each of the first body and the second body includes a support protrusion that is brought into contact with the substrate when the grip unit grips the substrate. The support protrusion includes a first inclined surface that supports the substrate and a second inclined surface that extends from the first inclined surface and that guides a position of the substrate. The second inclined surface is located farther away from the center of the substrate than the first inclined surface when the grip unit grips the substrate. The second inclined surface has a larger slope than the first inclined surface.

The first inclined surface may have a slope of less than 45 degrees, and the second inclined surface may have a slope of more than 45 degrees. The slope of the second inclined surface may be three or more times larger than the slope of the first inclined surface. The slope of the first inclined surface may be 15 degrees, and the slope of the second inclined surface may be 75 degrees.

The first inclined surface may have a shape that makes line contact with the substrate when the substrate is gripped by the grip unit. The substrate may have a rectangular shape. Each of the first body and the second body may include four support protrusions, and the support protrusions are provided in positions corresponding to corners of the substrate. Each of the support protrusions may further include an outside surface located adjacent to the first inclined surface and the second inclined surface, and each of the corners may be located in an area surrounded by the first inclined surface, the second inclined surface, and the outside surface.

The drive unit may include a gap adjustment member that adjusts a distance between the first body and the second body such that the distance between the first body and the second body is changed between a grip gap and a release gap and a rotary member that rotates the grip unit to reverse the substrate gripped by the grip unit. A height difference between the second inclined surface of the first body and the second inclined surface of the second body may be smaller than a thickness of the substrate in a position where the substrate is gripped by the grip unit.

The apparatus may further include a transfer unit that transfers the substrate into the process chamber. The transfer unit may include a hand and a mounting protrusion that is coupled to the hand and that supports the substrate. The mounting protrusion may include a first mounting surface that is inclined and that supports the substrate and a second mounting surface that extends from the first mounting surface and that is inclined to guide a position of the substrate. The second mounting surface may be located farther away from the center of the substrate than the first mounting surface when the transfer unit supports the substrate. The second mounting surface may have a larger slope than the first mounting surface. The slope of the first mounting surface of the mounting protrusion may be larger than the slope of the first inclined surface of the support protrusion of the reversing unit.

The apparatus may further include a buffer unit that stores the substrate. The buffer unit may include a holding protrusion that supports the substrate, and the holding protrusion of the buffer unit may include a first holding surface that is inclined and that supports the substrate and a second holding surface that extends from the first holding surface and that is inclined to guide a position of the substrate. The second holding surface may be located farther away from the center of the substrate than the first holding surface when the buffer unit supports the substrate. The second holding surface may have a larger slope than the first holding surface. The buffer unit and the reversing unit may be disposed to be stacked one above another.

The apparatus may further include a process module including a plurality of process chambers and an index module that transfers the substrate into or out of the process module. The reversing unit and the buffer unit may be disposed between the index module and the process module.

According to an exemplary embodiment, a reversing unit for reversing a substrate includes a grip unit that grips the substrate and a drive unit that rotates the grip unit to reverse the substrate gripped by the grip unit. The grip unit includes a first body that supports one of an upper surface and a lower surface of the substrate and a second body that supports the other surface of the substrate. Each of the first body and the second body includes a support protrusion that is brought into contact with the substrate when the grip unit grips the substrate. The support protrusion includes a first inclined surface that supports the substrate and a second inclined surface that extends from the first inclined surface and that guides a position of the substrate. The second inclined surface is located farther away from the center of the substrate than the first inclined surface when the grip unit grips the substrate. The second inclined surface has a larger slope than the first inclined surface.

The first inclined surface may have a slope of less than 45 degrees, and the second inclined surface may have a slope of more than 45 degrees. The first inclined surface may have a shape that makes line contact with the substrate when the substrate is gripped by the grip unit. The substrate may have a rectangular shape, and each of the first body and the second body may include four support protrusions that support corners of the substrate. Each of the support protrusions may further include an outside surface located adjacent to the first inclined surface and the second inclined surface, and each of the corners may be located in an area surrounded by the first inclined surface, the second inclined surface, and the outside surface.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
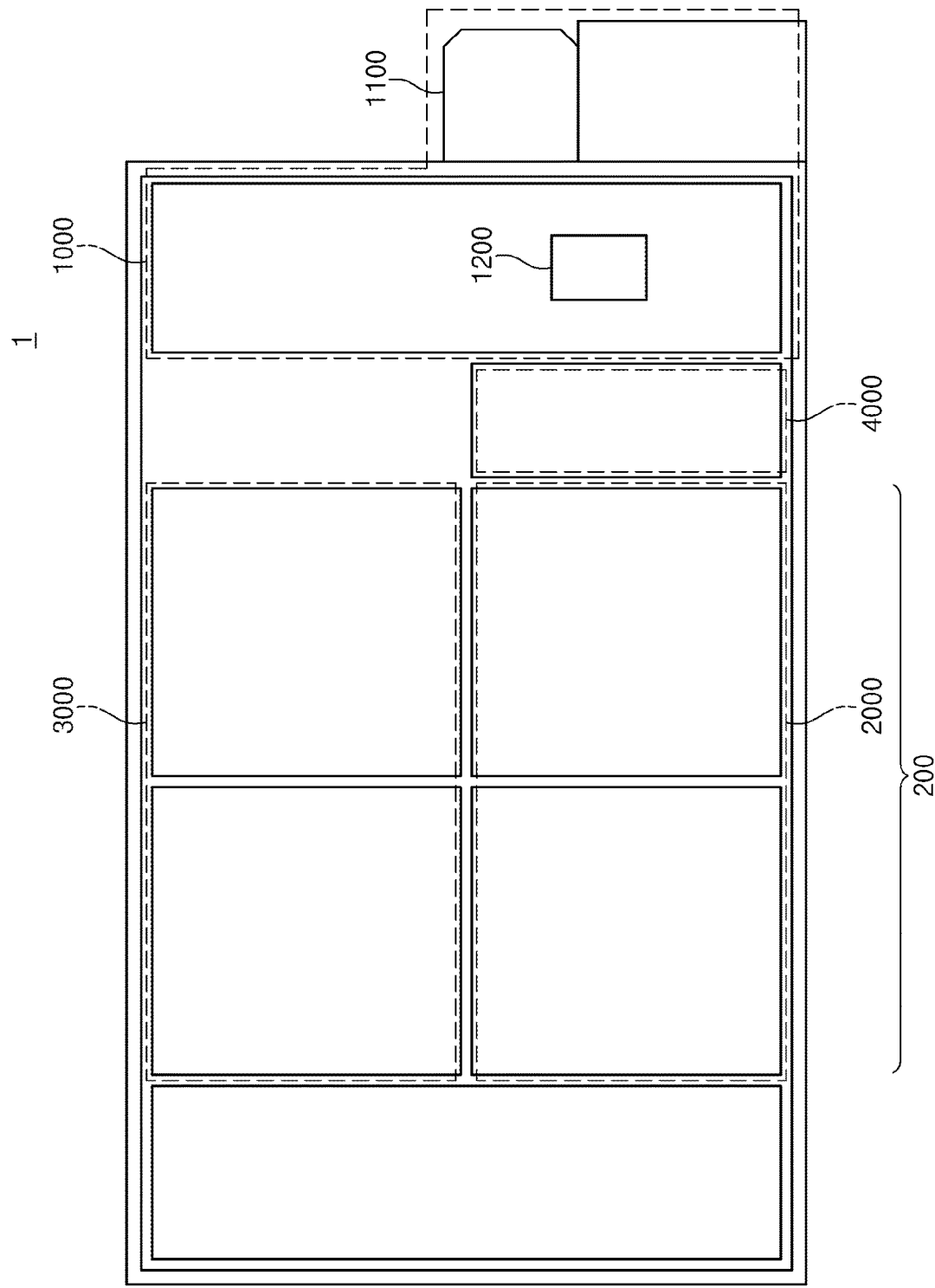
FIG. 1 is a view illustrating substrate treating equipment according to an embodiment of the inventive concept.

Hereinafter, substrate treating equipment according to an exemplary embodiment of the inventive concept will be described in detail with reference to the accompanying drawings. In adding the reference numerals to the components of each drawing, it should be noted that the identical or equivalent component is designated by the identical numeral even when they are displayed on other drawings. Further, in describing the inventive concept, a detailed description of well-known features or functions will be ruled out in order not to unnecessarily obscure the gist of the inventive concept.

EMBODIMENT

Figure 2:
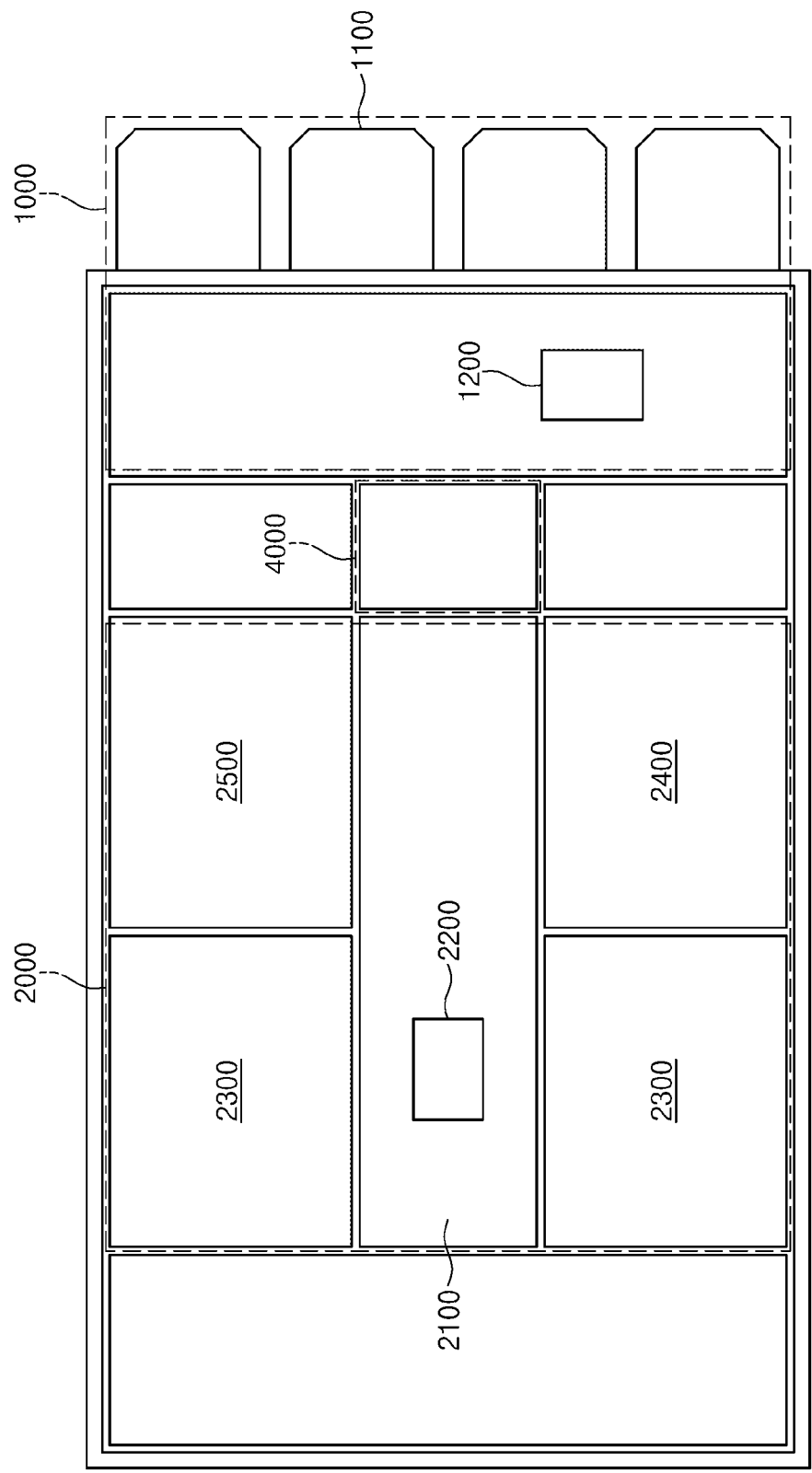
FIG. 2 is a view illustrating the layout of the first floor of the substrate treating equipment illustrated in FIG. 1.
Figure 3:
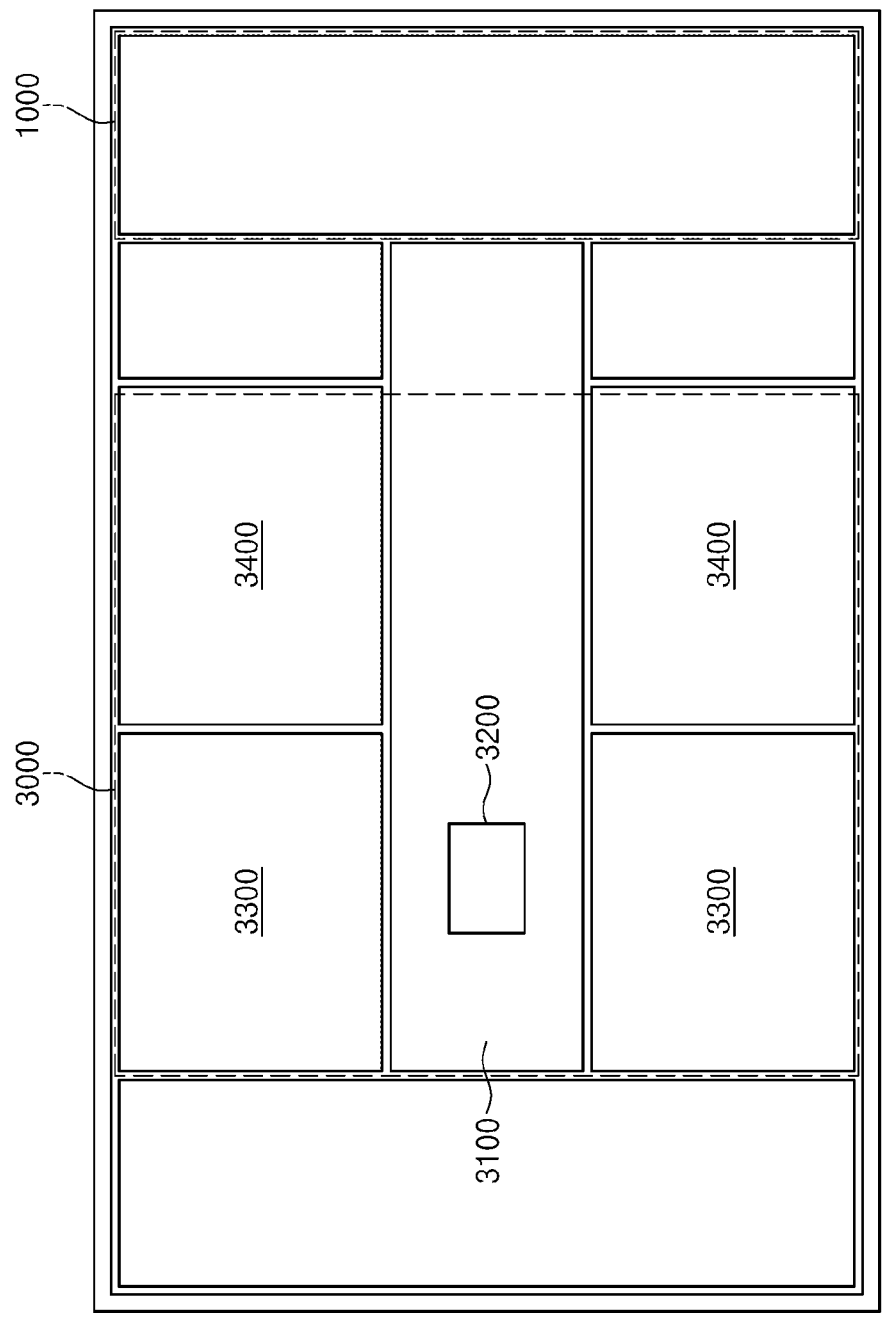
FIG. 3 is a view illustrating the layout of the second floor of the substrate treating equipment illustrated in FIG. 1.

FIG. 1 is a schematic view illustrating a configuration of substrate treating equipment according to an embodiment of the inventive concept. FIGS. 2 and 3 are views illustrating the layouts of the first and second floors of the substrate treating equipment illustrated in FIG. 1.

In this embodiment, a photomask in a rectangular plate shape will be described as an example of a substrate. However, the substrate may be various types of substrates, such as a semiconductor wafer, a flat display panel, and the like, in addition to the photomask. Furthermore, in this embodiment, it will be exemplified that the substrate treating equipment is equipment for cleaning the photomask. However, the substrate treating equipment may be equipment for performing a cleaning process on a different type of substrate such as a wafer. Alternatively, the substrate treating equipment may be equipment for performing a different type of process requiring that a substrate be reversed, in addition to the cleaning process, on the substrate such as the photomask or the wafer.

Referring to FIGS. 1 to 3, the substrate treating equipment 1 includes an index module 1000, a process module 200, and a buffer module 4000.

The index module 1000 includes four ports 1100 on which carriers, each of which has photomasks M received therein, are placed and an index robot 1200 for transferring the photomasks M. The photomasks M are received in each carrier in a state of being inverted such that patterned surfaces of the photomasks M are directed downward. Accordingly, contamination of the patterned surfaces of the photomasks M may be minimized. Before transferred into a first process unit 2000 or a second process unit 3000, the photomasks M are reversed in the buffer module 4000 such that the patterned surfaces are directed upward.

The process module 200 includes the first process unit 2000 and the second process unit 3000. In the first process unit 2000, wet cleaning is performed on the photomask M. The first process unit 2000 is connected with the buffer module 4000 and includes a first transfer passage 2100 in which a first transfer robot 2200 for transferring the photomask M is provided, process chambers 2300 and 2400 for removing glue, and photomask cooling process chambers 2500. The process chambers 2300 and 2400 and the photomask cooling process chambers 2500 are disposed along the first transfer passage 2100.

Three process chambers for removing glue and two photomask cooling process chambers may be provided.

The process chambers for removing the glue may include the front-surface processing chambers 2300 that apply an SPM solution to the front surface of the photomask M to remove the glue and the partial processing chamber 2400 that partially applies an SPM solution to the edge of the photomask M to remove the glue. Furthermore, the photomask cooling process chambers 2500 lower the temperature of the photomask M subjected to heat treatment in heating process chambers 3300 to room temperature.

The second process unit 3000 is disposed on a different floor so as to be divided from the first process unit 2000. In the second process unit 3000, dry cleaning and functional water cleaning are performed on the photomask M. The second process unit 3000 includes a second transfer passage 3100 in which a second transfer robot 3200 for transferring the photomask M is provided, the heating process chambers 3300, and functional-water process chambers 3400. The heating process chambers 3300 and the functional-water process chambers 3400 are disposed along the second transfer passage 3100. The heating process chambers 3300 may heat the photomask M using UV light. Two heating process chambers 3300 and two functional-water process chambers 3400 may be provided.

The buffer module 4000 is disposed between the process module 200 and the index module 1000. According to an embodiment, the buffer module 4000 is disposed between the first process unit 2000 and the index module 1000. Alternatively, the buffer module 4000 may be disposed between the second process unit 3000 and the index module 1000. The buffer module 4000 reverses the photomask M.

In the substrate treating equipment 1, the modules for wet cleaning are provided on the first floor, and the modules for dry cleaning are provided on the second floor. That is, the modules for wet cleaning using chemicals are disposed on the first floor to prevent ion contamination caused by a down flow from affecting the photomask M subjected to dry processing. For example, the substrate treating equipment 1 of the inventive concept may be configured such that both the modules for wet cleaning and the modules for dry cleaning are disposed on a single floor.

In this embodiment, it has been described that the process units include the process chambers for removing glue, the photomask cooling process chambers, the heating process chambers, and the functional-water process chambers. However, the types of process modules provided in the process units may vary depending on the type of substrate to be treated and a treating process.

The substrate treating equipment 1 may simultaneously treat up to five photomasks M, thereby achieving high productivity.

The photomask M is very vulnerable to static electricity because the patterned surface of the photomask M contains a chromium (Cr) component. Accordingly, to minimize damage caused by static electricity, the substrate treating equipment 1 of the inventive concept may include ionizers provided on the moving paths (e.g., in the first transfer passage 2100, in the second transfer passage 3100, and in the process modules).

Figure 4:
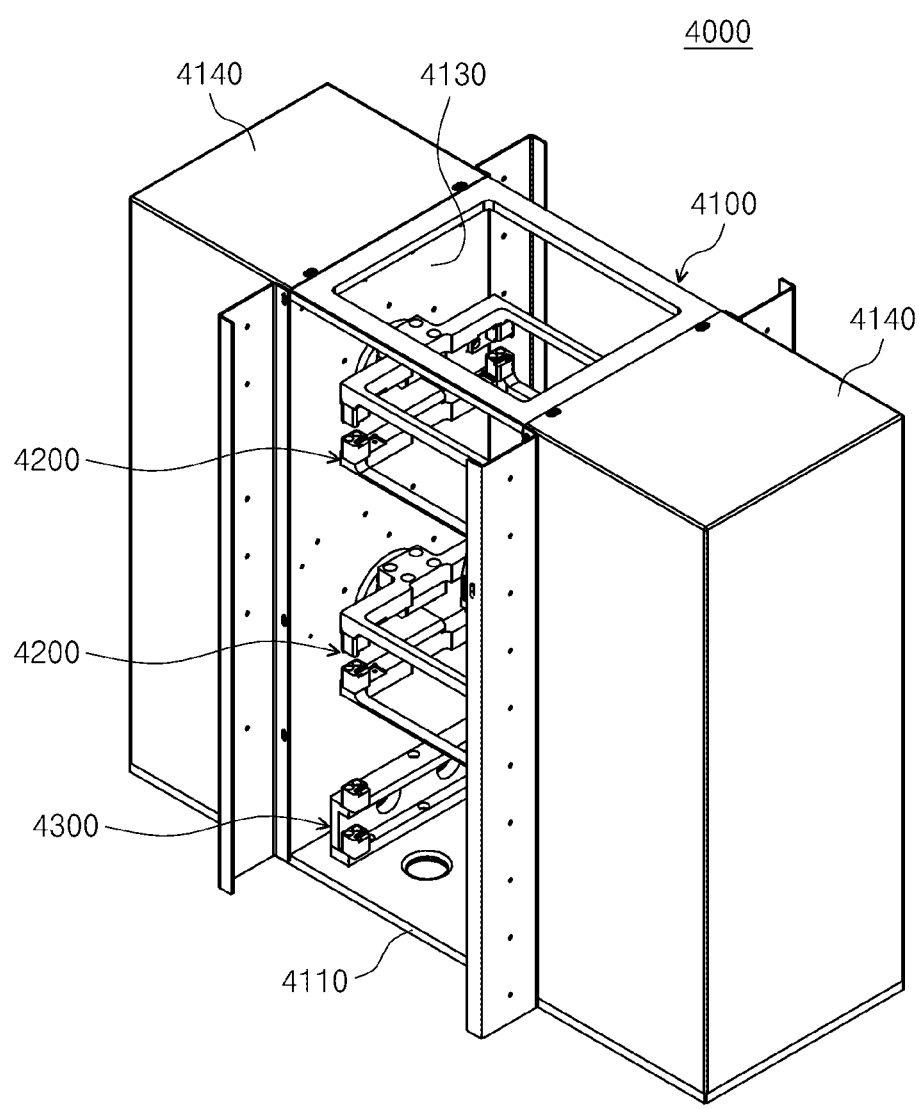
FIG. 4 is a perspective view of a buffer module.
Figure 5:
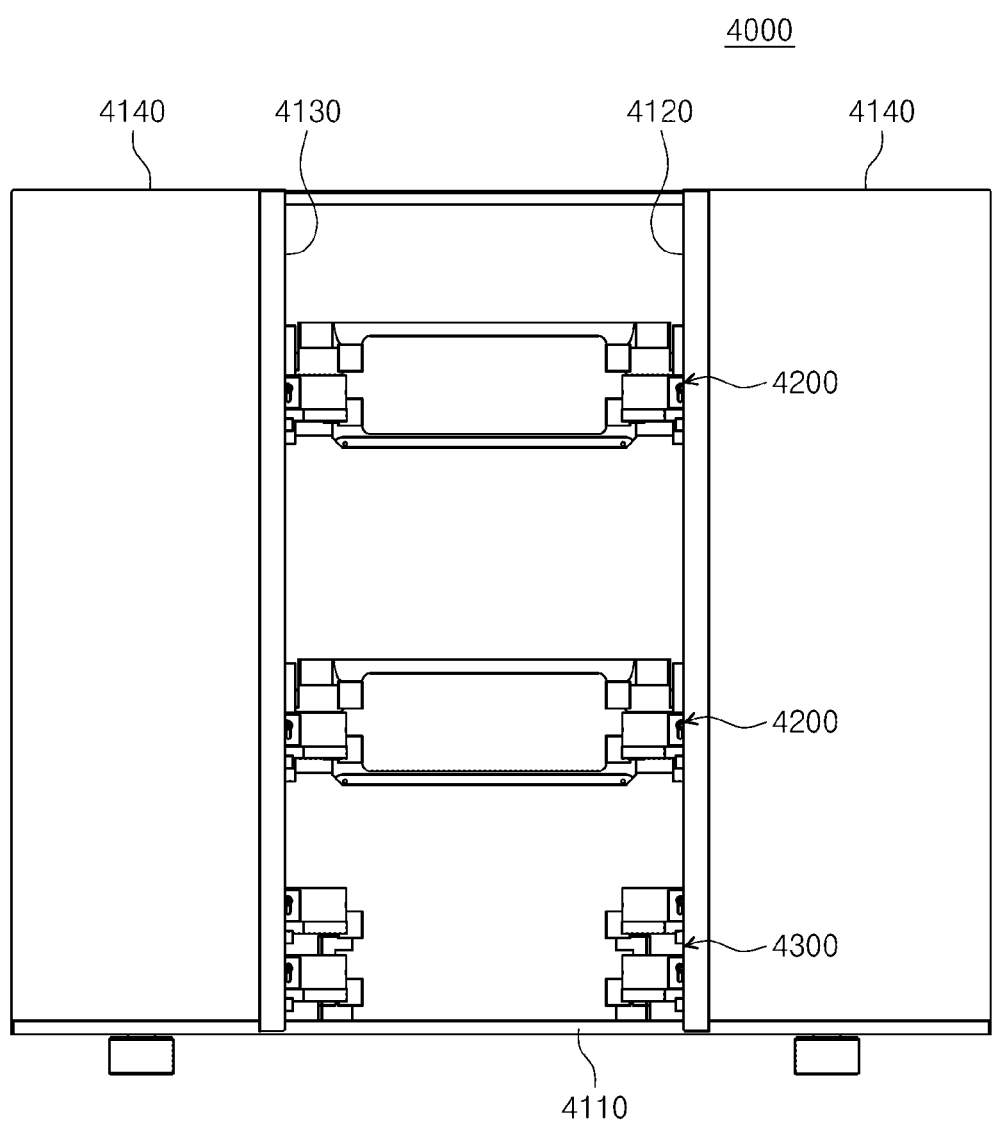
FIG. 5 is a front view of the buffer module.
Figure 6:
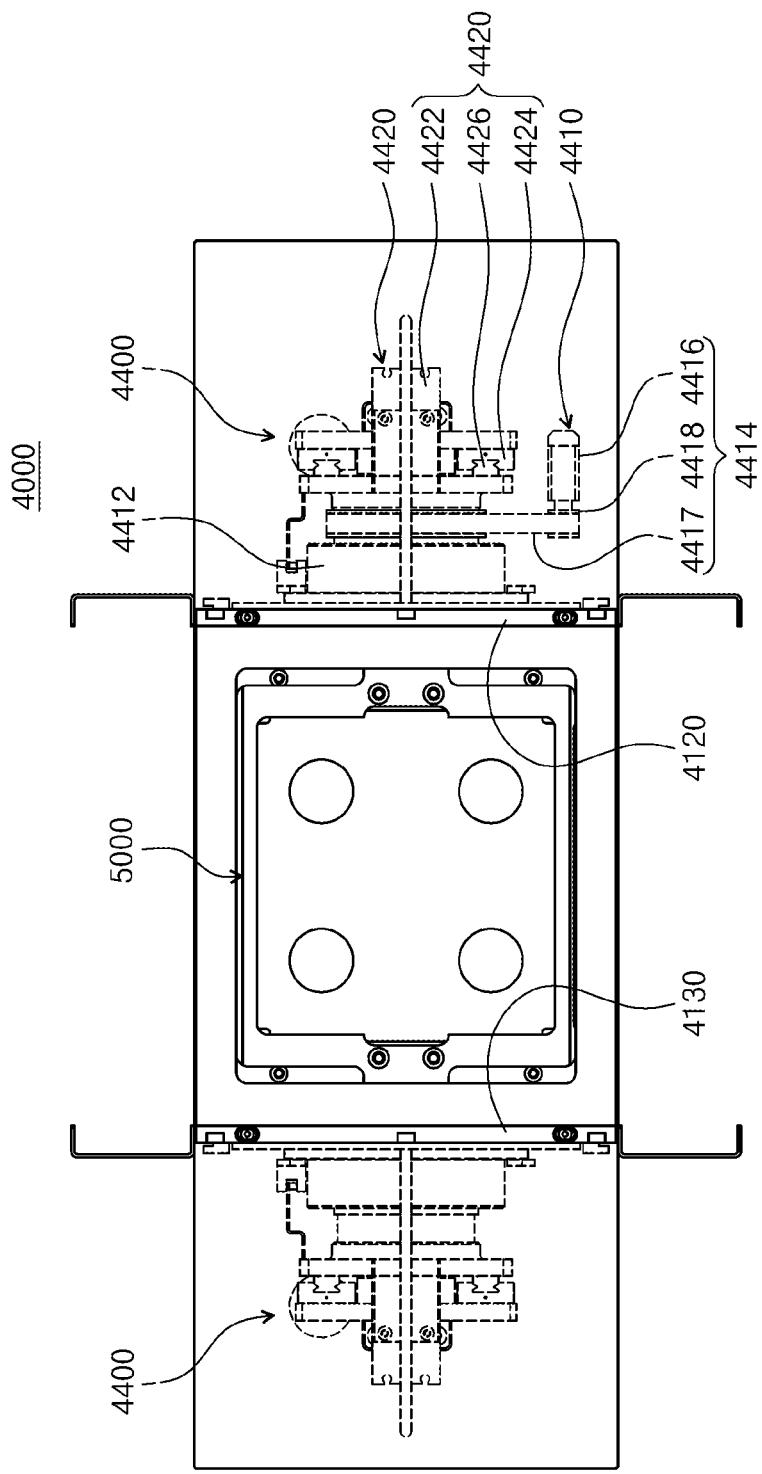
FIG. 6 is a plan view of the buffer module.
Figure 7:
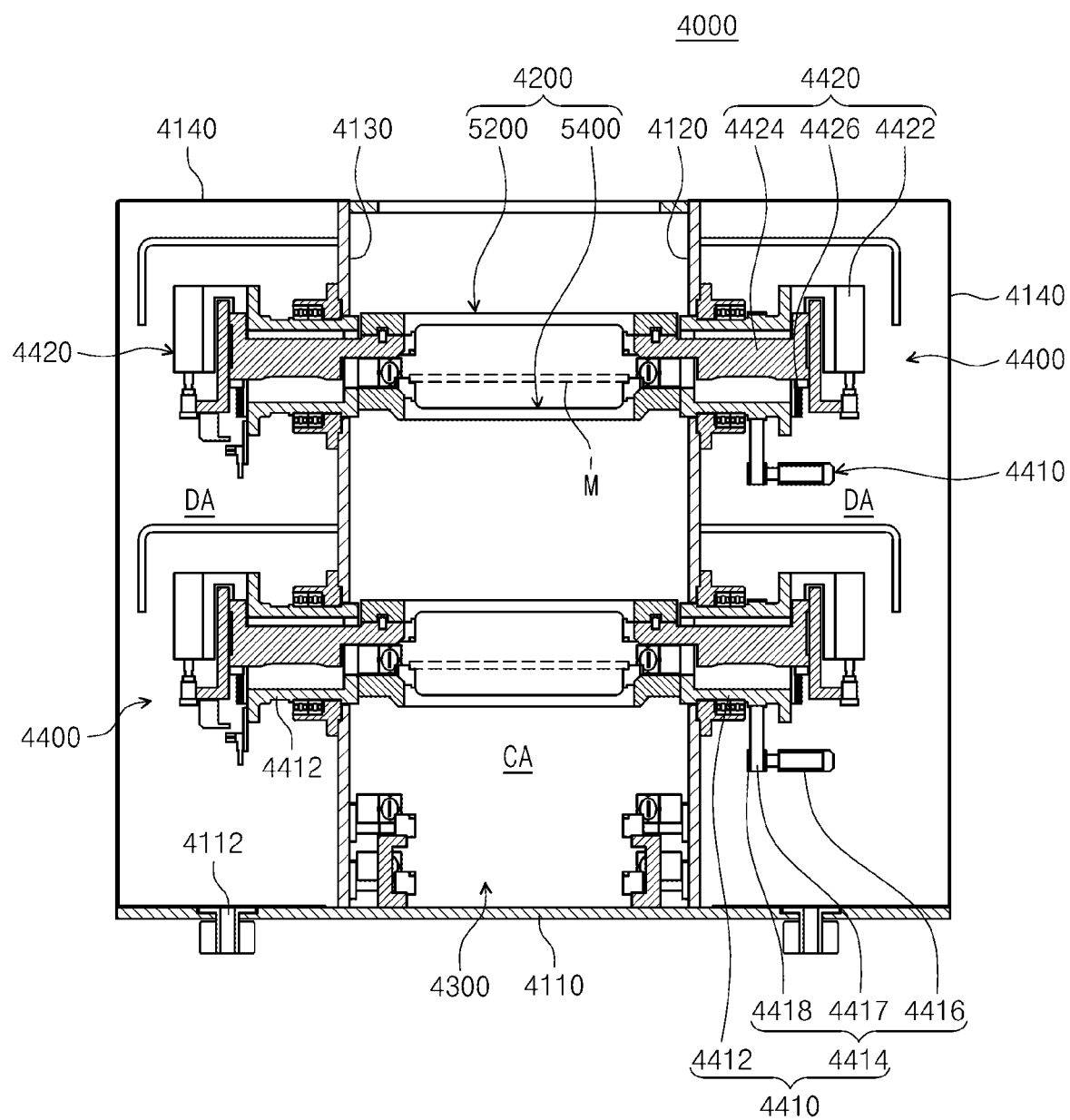
FIG. 7 is a sectional view of the buffer module.

FIG. 4 is a perspective view of the buffer module. FIG. 5 is a front view of the buffer module. FIG. 6 is a plan view of the buffer module. FIG. 7 is a sectional view of the buffer module. Referring to FIGS. 4 to 7, the buffer module 4000 includes a frame 4100, reversing units 4200 having a reversing function, and buffer units 4300 having a simple buffer function. Two reversing units 4200 and two buffer units 4300 may be provided.

The frame 4100 includes a base plate 4110, a first vertical plate 4120, a second vertical plate 4130, and two space-defining covers 4140.

The first vertical plate 4120 and the second vertical plate 4130 are vertically mounted on the base plate 4110. The first vertical plate 4120 and the second vertical plate 4130 are disposed to be spaced apart from each other. The space between the first vertical plate 4120 and the second vertical plate 4130 is defined as a central space CA (a space in which a photomask M is stored and reversed), and the space on the right side of the first vertical plate 4120 and the space on the left side of the second vertical plate 4130 are defined as drive part spaces DA. The central space CA is open at the front side and the rear side such that the photomask M is able to be placed in or extracted from the central space CA, and the reversing units 4200 and the buffer units 4300 are stacked one above another in the central space CA. Drive units 4400 of the reversing units 4200 are mounted in the drive part spaces DA. The drive part spaces DA are isolated from an external environment by the space-defining covers 4140. The base plate 4110 of the frame 4100 includes intake ports 4112 for forming exhaust pressure (negative pressure) in the drive part spaces DA. That is, the drive part spaces DA are isolated from the external environment by the space-defining covers 4140, and negative pressure (exhaust pressure) is formed in the drive part spaces DA through the intake ports 4112. Accordingly, an air flow into the central space DA is suppressed.

The reversing units 4200 are installed through the first vertical plate 4120 and the second vertical plate 4130 so as to be rotatable. Each of the reversing units 4200 includes a grip unit 5000 and the drive unit 4400. The grip unit 5000 includes a first body 5200 that supports one of an upper surface and a lower surface of the photomask M and a second body 5400 that supports the other surface of the photomask M. The first body 5200 and the second body 5400 are located to face each other, with the photomask M therebetween. The first body 5200 is raised or lowered in the vertical direction to hold the edge of the photomask M placed on the second body 5400. Each of the first body 5200 and the second body 5400 includes a support 5410 and a support protrusion 5420. The supports 5410 of the first body 5200 and the second body 5400 have a rectangular frame shape when viewed from above. Each of the first body 5200 and the second body 5400 includes a plurality of support protrusions 5420 that support the corners of the photomask M. The support protrusions 5420 may be arranged to have a rectangular ring shape by a combination thereof. According to an embodiment, each of the first body 5200 and the second body 5400 may have the same number of support protrusions 5420 as the corners of the photomask M. Each of the first body 5200 and the second body 5400 may include four support protrusions 5420.

The drive unit 4400 includes a rotary member 4410 and gap adjustment members 4420. The drive unit 4400 is located in the drive part spaces DA to prevent back contamination of the photomask M by particles generated from the drive unit 4400.

The rotary member 4410 includes two rotating bodies 4412 and one rotary drive part 4414.

The rotating bodies 4412 are provided to correspond to the first vertical plate 4120 and the second vertical plate 4130, respectively. The rotary drive part 4414 is provided on the first vertical plate 4120. The rotary drive part 4414 includes a motor 4416, a belt 4417, and a pulley 4418 to reverse the rotating bodies 4412 by 180 degrees. The rotating bodies 4412 have a hollow shape with a passage inside. Opposite ends of the second body 5400 are fixed to the rotating bodies 4412.

Each of the gap adjustment members 4420 includes a cylinder 4422, a connecting block 4424, and an LM guide 4426. The cylinders 4422 are fixedly mounted on the outsides of the rotating bodies 4412 located in the drive part spaces DA. The connecting blocks 4424 are raised and lowered by the cylinders 4422. The LM guides 4426 are fixedly attached to the rotating bodies 4412. The LM guides 4426 guide the connecting blocks 4424 raised or lowered by the cylinders 4422. The connecting blocks 4424 are connected with the first body 5200, which is located in the central space CA, through the internal passages of the rotating bodies 4412. The gap adjustment members 4420 raise and lower the first body 5200 such that the distance between the first body 5200 and the second body 5400 corresponds to a grip gap and a release gap. Here, the grip gap is a position where the photomask M is gripped by the first body 5200 and the second body 5400, and the release gap is a position where one of the first body 5200 and the second body 5400 is separated from the photomask M.

The buffer units 4300 are located under the reversing units 4200. The buffer units 4300 have a simple buffer function of temporarily storing the photomask M. Each of the buffer units 4300 includes a support body. The support body includes a plurality of holding protrusions that support the corners of the photomask M. Each of the holding protrusions has a first holding surface and a second holding surface. The holding protrusions of the buffer unit 4300 have the same shape as the support protrusions 5420 of the reversing units 4200. For example, the first holding surface may have the same shape as a first inclined surface 5422, and the second holding surface may have the same shape as a second inclined surface 5424. Therefore, specific description of the support protrusions of the buffer unit 4300 will be omitted.

Figure 8:
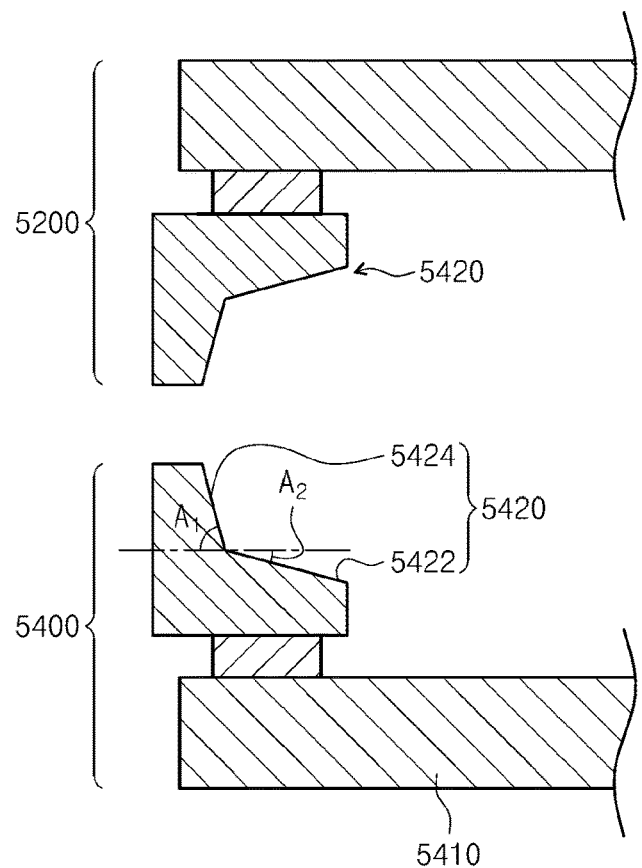
FIG. 8 is an enlarged perspective view of a support protrusion of FIG. 7.
Figure 9:
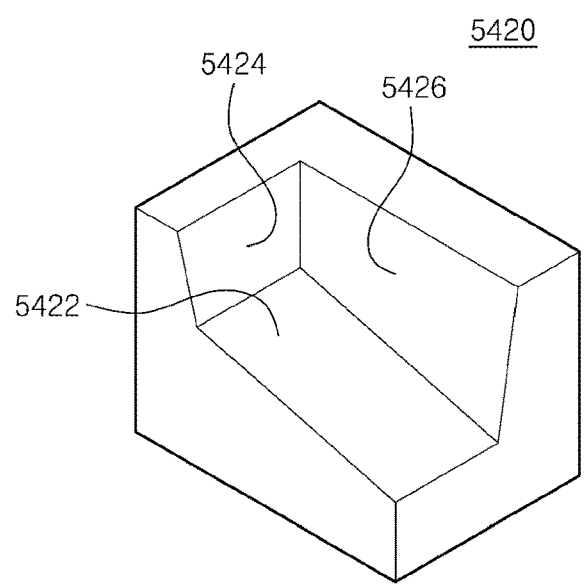
FIG. 9 is a sectional view of the support protrusion of FIG. 8.

Next, the support protrusions 5420 of the first body 5200 and the second body 5400 will be described in more detail. FIG. 8 is an enlarged perspective view of the support protrusion of FIG. 7. FIG. 9 is a sectional view of the support protrusion of FIG. 8.

Referring to FIGS. 8 and 9, the support protrusion 5420 is a part that makes direct contact with the photomask M when the photomask M is gripped. The support protrusion 5420 makes line contact with the photomask M and supports the photomask M. The support protrusion 5420 has the first inclined surface 5422, the second inclined surface 5424, and an outside surface 5426. The first inclined surface 5422, the second inclined surface 5424, and the outside surface 5426 are provided as surfaces extending from each other. The area formed by the first inclined surface 5422, the second inclined surface 5424, and the outside surface 5426 serves as a support area that supports a corner of the photomask M. That is, when the photomask M is supported by the support protrusion 5420, the corner of the photomask M is surrounded by the first inclined surface 5422, the second inclined surface 5424, and the outside surface 5426. When the photomask M is supported by the support protrusion 5420, the first inclined surface 5422 serves as a surface that makes contact with the photomask M, and the second inclined surface 5424 serves a surface that guides the photomask M to allow the photomask M to be brought into contact with and supported on the first inclined surface 5422. The second inclined surface 5424 extends from the first inclined surface 5422. The second inclined surface 5424 is located farther away from the center of the photomask M than the first inclined surface 5422. The first inclined surface 5422 and the second inclined surface 5424 are inclined with respect to the horizontal plane. The slope $A_2$ of the first inclined surface 5422 and the slope $A_1$ of the second inclined surface 5424 differ from each other. Here, the slopes are defined as angles between the horizontal plane and the inclined surfaces. The second inclined surface 5424 has a larger slope than the first inclined surface 5422. Accordingly, even though the photomask M is placed in a position rather than the correct position, the photomask M is guided toward the first inclined surface 5422 by the second inclined surface 5424 and is adjusted to a horizontal state in a state of being placed on the first inclined surface 5422. The photomask M makes line contact with the first inclined surface 5422. According to an embodiment, the slope $A_2$ of the first inclined surface 5422 may be less than 45 degrees, and the slope $A_1$ of the second inclined surface 5424 may be 45 degrees or more. The slope $A_1$ of the second inclined surface 5424 may be three or more times larger than the slope $A_2$ of the first inclined surface 5422. For example, the slope $A_2$ of the first inclined surface 5422 may be 15 degrees, and the slope $A_1$ of the second inclined surface 5424 may be 75 degrees.

Figure 10:
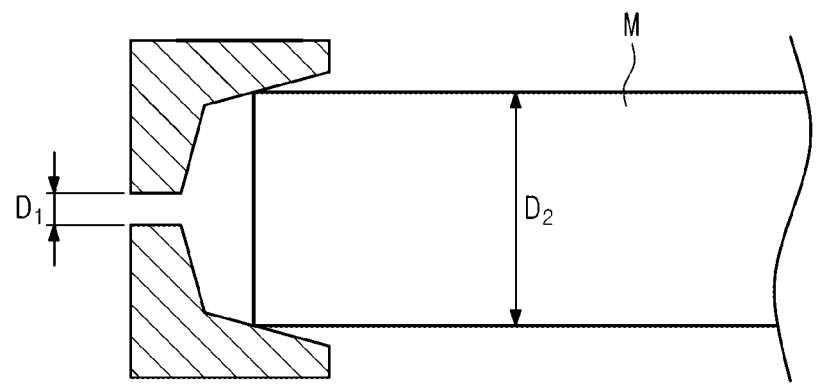
FIGS. 10 and 11 are views illustrating a grip gap and a release gap between support protrusions.
Figure 11:
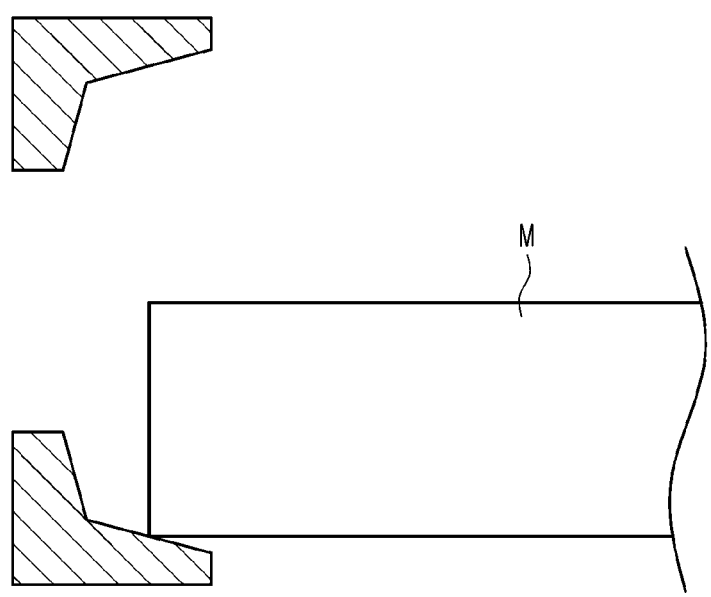

FIGS. 10 and 11 are views illustrating the grip gap and the release gap between the support protrusions. Referring to FIGS. 10 and 11, the first body 5200 and the second body 5400 are located such that the second inclined surfaces 5424 are spaced apart from each other. The first body 5200 and the second body 5400 are located to be spaced apart from each other by the grip gap while gripping the photomask M. That is, the height difference $D_1$ between the second inclined surface 5424 of the first body 5200 and the second inclined surface 5424 of the second body 5400 is smaller than the thickness $D_2$ of the photomask M. The first body 5200 and the second body 5400, which are spaced apart from each other by the grip gap, may be rotated to reverse the photomask M.

Each of the outside surfaces 5426 extends from the first inclined surface 5422 and the second inclined surface 524. The photomask M may have a corner formed by a first side and a second side. The first inclined surface 5422 and the second inclined surface 5424 may face the first side, and the outside surface 5426 may face the second side. The outside surface 5426 may serve as a stopper to prevent the photomask M from departing from a predetermined range.

In the above-described embodiment, it has been described that the support protrusions 5420 and the holding protrusions of the buffer unit 4300 that support the photomask M in the buffer module 4000 have the first inclined surface 5422 and the second inclined surface 5424.

However, the first transfer robot 2200 and the second transfer robot 3200 for transferring the photomask M may each include a hand 6410 and mounting protrusions 6420.

Figure 12:
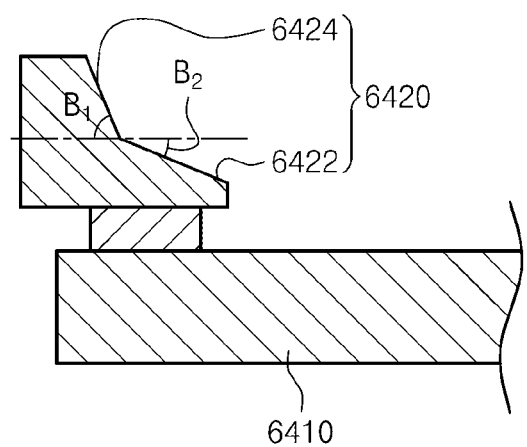
FIG. 12 is a perspective view illustrating a mounting protrusion of a transfer robot of FIG. 2.
Figure 13:
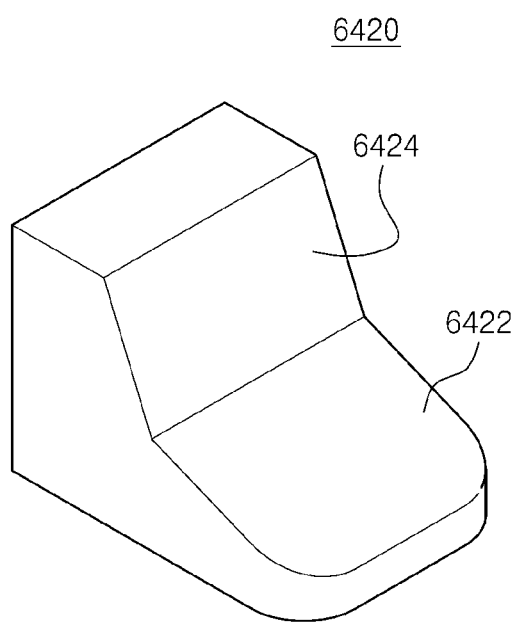
FIG. 13 is a sectional view illustrating the mounting protrusion of the transfer robot of FIG. 12.

FIG. 12 is a perspective view illustrating a mounting protrusion of the transfer robot of FIG. 2. FIG. 13 is a sectional view illustrating the mounting protrusion of the transfer robot of FIG. 12. Referring to FIGS. 12 and 13, the mounting protrusions 6420 are coupled to the hand 6410 and support different areas of the photomask M. Each of the mounting protrusions 6420 has a first mounting surface 6422 and a second mounting surface 6424, and the mounting surfaces 6422 and 6424 are inclined. The second mounting surface 6424 extends from the first mounting surface 6422 and is inclined to guide the photomask M toward the first mounting surface 6422. When the photomask M is supported by the transfer robots 2200 and 3200, the second mounting surfaces 6424 are located farther away from the center of the photomask M than the first mounting surfaces 6422. The second mounting surfaces 6424 have a larger slope than the first mounting surfaces 6422. According to an embodiment, the first mounting surfaces 6422 may have a larger slope than the first inclined surfaces 5422. Unlike the reversing units 4200 and the buffer units 4300, the transfer robots 2200 and 3200 move in a state of supporting the photomask M. Due to this, if the first mounting surfaces 6422 and the first inclined surfaces 5422 have the same slope, a variation in the position of the photomask M may be greater when the photomask M is supported on the transfer robots 2200 and 3200 than when the photomask M is supported on the reversing units 4200 and the buffer units 4300. Accordingly, the first mounting surfaces 6422 may have a larger slope than the first inclined surfaces 5422, thereby minimizing a position variation during the transfer of the photomask M. For example, the first mounting surfaces 6422 may have a slope $B_2$ of 22.5 degrees. The second mounting surfaces 6424 may have a slope $B_1$ of 45 degrees or more.

As described above, according to the embodiments of the inventive concept, the support protrusion has the two inclined surfaces with different slopes. Accordingly, the support protrusion may minimize contamination of a substrate at the same time as gripping the substrate by making line contact with the substrate.

Furthermore, according to the embodiments of the inventive concept, the second inclined surface has a slope of more than 45 degrees, thereby guiding a substrate into a horizontal state.

In addition, according to the embodiments of the inventive concept, the first inclined surface of the transfer unit has a larger slope than the first inclined surface of the buffer unit. Accordingly, a variation in the position of a substrate may be prevented during the transfer of the substrate.

Hereinabove, although the inventive concept has been described with reference to exemplary embodiments and the accompanying drawings, the inventive concept is not limited thereto, but may be variously modified and altered by those skilled in the art to which the inventive concept pertains without departing from the spirit and scope of the inventive concept claimed in the following claims. Therefore, the exemplary embodiments of the inventive concept are provided to explain the spirit and scope of the inventive concept, but not to limit them, so that the spirit and scope of the inventive concept is not limited by the embodiments. The scope of the inventive concept should be construed on the basis of the accompanying claims, and all the technical ideas within the scope equivalent to the claims should be included in the scope of the inventive concept.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
a process chamber configured to perform a predetermined process on the substrate; and
a reversing unit configured to reverse the substrate,
wherein the reverse unit includes:
a grip unit configured to grip the substrate; and
a drive unit configured to rotate the grip unit to reverse the substrate gripped by the grip unit,
wherein the grip unit includes:
a first body configured to support one of an upper surface and a lower surface of the substrate; and
a second body configured to support the other surface of the substrate,
wherein each of the first body and the second body includes a support protrusion that is brought into contact with the substrate when the grip unit grips the substrate,
wherein the support protrusion includes:
a first inclined surface configured to support the substrate; and
a second inclined surface extending from the first inclined surface and configured to guide a position of the substrate,
wherein the second inclined surface is located farther away from the center of the substrate than the first inclined surface when the grip unit grips the substrate, and
wherein the second inclined surface has a larger slope than the first inclined surface.

2. The apparatus of claim 1, wherein the first inclined surface has a slope of less than 45 degrees, and the second inclined surface has a slope of more than 45 degrees.

3. The apparatus of claim 2, wherein the slope of the second inclined surface is three or more times larger than the slope of the first inclined surface.

4. The apparatus of claim 3, wherein the slope of the first inclined surface is 15 degrees, and the slope of the second inclined surface is 75 degrees.

5. The apparatus of claim 1, wherein the first inclined surface has a shape that makes line contact with the substrate when the substrate is gripped by the grip unit.

6. The apparatus of claim 5, wherein the substrate has a rectangular shape,
wherein each of the first body and the second body includes four support protrusions, and
wherein the support protrusions are provided in positions corresponding to corners of the substrate.

7. The apparatus of claim 6, wherein each of the support protrusions further includes an outside surface located adjacent to the first inclined surface and the second inclined surface, and
wherein each of the corners is located in an area surrounded by the first inclined surface, the second inclined surface, and the outside surface.

8. The apparatus of claim 5, wherein the drive unit includes:
a gap adjustment member configured to adjust a distance between the first body and the second body such that the distance between the first body and the second body is changed between a grip gap and a release gap; and a rotary member configured to rotate the grip unit to reverse the substrate gripped by the grip unit.

9. The apparatus of claim 8, wherein a height difference between the second inclined surface of the first body and the second inclined surface of the second body is smaller than a thickness of the substrate in a position where the substrate is gripped by the grip unit.

10. The apparatus of claim 1, wherein the apparatus further comprises a transfer unit configured to transfer the substrate into the process chamber,
wherein the transfer unit includes:
a hand; and
a mounting protrusion coupled to the hand and configured to support the substrate,
wherein the mounting protrusion includes:
a first mounting surface that is inclined and is configured to support the substrate; and
a second mounting surface extending from the first mounting surface and inclined to guide a position of the substrate,
wherein the second mounting surface is located farther away from the center of the substrate than the first mounting surface when the transfer unit supports the substrate, and
wherein the second mounting surface has a larger slope than the first mounting surface.

11. The apparatus of claim 10, wherein the slope of the first mounting surface of the mounting protrusion is larger than the slope of the first inclined surface of the support protrusion of the reversing unit.

12. The apparatus of claim 1, wherein the apparatus further comprises a buffer unit configured to store the substrate,
wherein the buffer unit includes a holding protrusion configured to support the substrate,
wherein the holding protrusion of the buffer unit includes:
a first holding surface that is inclined and is configured to support the substrate; and
a second holding surface extending from the first holding surface and inclined to guide a position of the substrate,
wherein the second holding surface is located farther away from the center of the substrate than the first holding surface when the buffer unit supports the substrate, and
wherein the second holding surface has a larger slope than the first holding surface.

13. The apparatus of claim 12, wherein the buffer unit and the reversing unit are disposed to be stacked one above another.

14. The apparatus of claim 1, wherein the apparatus further comprises:

a process module including a plurality of process chambers; and
an index module configured to transfer the substrate into or out of the process module, and
wherein the reversing unit and the buffer unit are disposed between the index module and the process module.

15. A reversing unit for reversing a substrate, the reversing unit comprising:
a grip unit configured to grip the substrate; and
a drive unit configured to rotate the grip unit to reverse the substrate gripped by the grip unit,
wherein the grip unit includes:
a first body configured to support one of an upper surface and a lower surface of the substrate; and
a second body configured to support the other surface of the substrate,
wherein each of the first body and the second body includes a support protrusion that is brought into contact with the substrate when the grip unit grips the substrate,
wherein the support protrusion includes:
a first inclined surface configured to support the substrate; and
a second inclined surface extending from the first inclined surface and configured to guide a position of the substrate,
wherein the second inclined surface is located farther away from the center of the substrate than the first inclined surface when the grip unit grips the substrate, and
wherein the second inclined surface has a larger slope than the first inclined surface.

16. The reversing unit of claim 15, wherein the first inclined surface has a slope of less than 45 degrees, and the second inclined surface has a slope of more than 45 degrees.

17. The reversing unit of claim 15, wherein the first inclined surface has a shape that makes line contact with the substrate when the substrate is gripped by the grip unit.

18. The reversing unit of claim 17, wherein the substrate has a rectangular shape, and
wherein each of the first body and the second body includes four support protrusions configured to support corners of the substrate.

19. The reversing unit of claim 18, wherein each of the support protrusions further includes an outside surface located adjacent to the first inclined surface and the second inclined surface, and
wherein each of the corners is located in an area surrounded by the first inclined surface, the second inclined surface, and the outside surface.

* * * * *